United States Patent [19]

Wrinn et al.

[11] Patent Number: 4,660,197
[45] Date of Patent: Apr. 21, 1987

[54] CIRCUITRY FOR SYNCHRONIZING A MULTIPLE CHANNEL CIRCUIT TESTER

[75] Inventors: Joseph F. Wrinn, North Quincy; Lawrence Heller, Wayland; Jiann-Neng Chen, Newton; Jacqueline N. Brenner, Brookline, all of Mass.

[73] Assignee: Teradyne, Inc., Boston, Mass.

[21] Appl. No.: 794,303

[22] Filed: Nov. 1, 1985

[51] Int. Cl.<sup>4</sup> .......................................... G01R 31/28
[52] U.S. Cl. ...................................... 371/1; 324/73 R
[58] Field of Search .............................. 371/1, 25, 20; 324/73 R, 73 AT, 73 PC

[56] References Cited

U.S. PATENT DOCUMENTS

| Re. 31,056 | 10/1982 | Chau et al. | 324/73 R |
| 3,976,940 | 8/1976 | Chau et al. | 324/73 R |
| 4,392,105 | 7/1983 | McLeod | 324/57 |
| 4,489,272 | 12/1984 | McLeod | 324/73 |
| 4,497,056 | 1/1985 | Sugamori | 371/1 X |

Primary Examiner—Charles E. Atkinson

[57] ABSTRACT

Quickly synchronizing adjustable delay circuits for a multiple channel tester by using a timing pulse that has reached the end of a given path in the tester to trigger the following timing pulse of a timing generator, thereby providing oscillating timing pulses having an associated frequency related to the propagation delay associated with the particular path, comparing the associated frequency with a reference frequency and adjusting a delay provided in the path until the associated frequency matches a desired frequency.

18 Claims, 6 Drawing Figures

CIRCUITRY FOR SYNCHRONIZING A MULTIPLE CHANNEL CIRCUIT TESTER

FIELD OF THE INVENTION

The invention relates to synchronizing a multiple channel circuit tester.

BACKGROUND OF THE INVENTION

The test signals of various channels of a multiple channel tester can have different propagation delays associated with the different paths from the common clock driving all channels of the tester to the outputs of the drivers. To guarantee that the drivers for the various channels operate synchronously under the various operating conditions, adjustable delays have been provided for the different paths to the drivers in some multiple channel testers. The adjustments often are made at the beginning of a new eight-hour shift, as there is a tendency for the propagation delays to change with time. A method of measuring delays associated with the different paths that has been used is the time domain reflection technique, requiring averaging of plural measurements to offset random jitter owing to noise.

SUMMARY OF THE INVENTION

It has been found that adjustable delay circuits for a multiple channel tester can be quickly set to synchronize the test signals provided at the driver outputs by using a timing pulse that has reached the end of a given path in the tester to trigger the following timing pulse of a timing generator, thereby providing oscillating timing pulses having an associated frequency related to the propagation delay associated with the particular path, comparing the associated frequency with a reference frequency and adjusting a delay provided in the path until the associated frequency matches a desired frequency.

In preferred embodiments a timing pulse is triggered on sensing either the leading or the trailing edge of the preceding timing pulse; the frequencies are compared using a time counter and an event counter that counts the trigger pulses provided during a known time window; there are separate delay lines in the circuitry for the indiviual drivers; each driver has three separate delay lines associated with: a timing pulse providing the leading edge of the driver output, a timing pulse providing the trailing edge of the driver output, and a timing pulse for turning the driver on and off; a multiplexer connecting the outputs of the various drivers to the means providing the trigger pulses has equal propagation delays associated with all paths through it from the various drivers; adjustable delays are provided for the different paths through a period generator and a phase generator; and the circuitry providing the trigger pulses has equal propagation delays in the different paths through it. An advantage of this system is that jitter due to noise and degraded edge speed is automatically dealt with by the period-averaging method employed by the circuitry.

Other advantages and features of the invention will be apparent from the following description of a preferred embodiment thereof and from the claims.

DESCRIPTION OF TEH PREFERRED EMBODIMENT

The drawings will be briefly described first.

DRAWINGS

STRUCTURE

Figure 1:
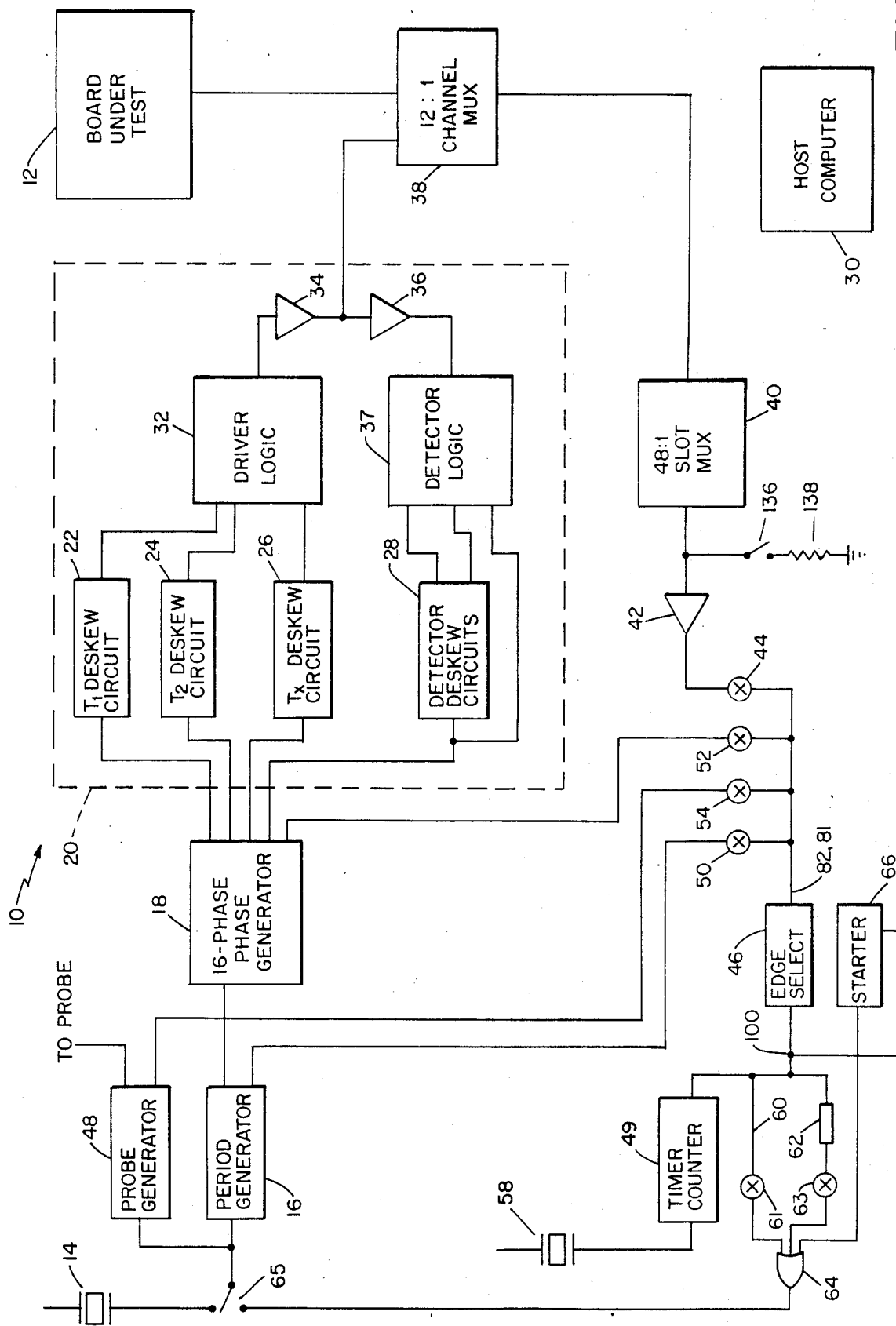
FIG. 1 is a block diagram of a multiple channel tester with channel synchronizing circuitry according to the invention.
Figure 5:
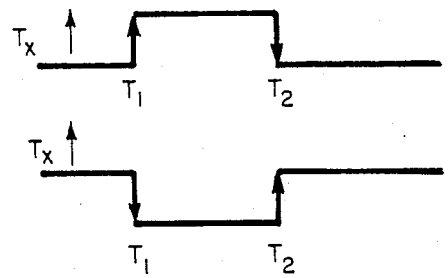
FIG. 5 is a graph showing timing of the FIG. 1 tester.

Referring to FIG. 1, there is shown multiple channel tester 10 used to provide test signals to a plurality of nodes of board under test 12 and to detect the response at a plurality of nodes. Multiple channel tester includes clock 14, which drives period generator 16 and 16-phase phase generator 18, which in turn provide timing pulses to 576 driver/detector channels located on 48 separate cards (12 channels per card). The components 20 for a single channel are indicated on FIG. 1. They include 3 driver deskew circuits 22, 24, 26, detector deskew circuits 28, driver logic 32, driver 34, detector 36, and detector logic 37. Deskew circuits 22-28 are controlled by host computer 30 (a digital control processor), as are the other elements of tester 10. Three deskew circuits are associated with a single driver, because there are two separate timing pulses provided to driver logic 32 to establish the timing of the leading edge ($T_1$) and trailing edge ($T_2$) of a driver output pulse provided to a pin of a board under test, and there also is a separate timing pulse used to turn the driver on or off (Tx), e.g., to disconnect it during detection. FIG. 5 shows the relationship of the times for $T_1$, $T_2$, and T x for a driver output pulse with a positive leading edge and negative trailing edge (on top), and an output pulse with a negative leading edge and positive trailing edge (on bottom). Driver 34 converts the differential ECL signal provided to it to the particular signal (e.g., TTL, CMOS) being provided to the board under test.

Each driver 34 on a card is connected by the card's 12 to 1 channel multiplexer 38 to 48-to 1 slot multiplexer 40 located on a separate autocalibration support card, which includes the elements shown on the bottom third of FIG. 1, with the exception of host computer 30. The elements between clock 14 and the drivers 34 and probe generator 48 include different paths for transmitting various timing pulses and are referred to herein as the timing pulse circuitry. Channel multiplexer 38 either connects the drivers (or detectors) to respective pins of a board under test 12 or connects one of the twelve channels on a card to a single input to slot multiplexer 40. Both channel multiplexer 38 and slot multiplexer 40 have symmetrical tree structures for the conductive paths through them so that there are equal propagation delays between any of the 576 drivers and the output of slot multiplexer 40.

The output of slot multiplexer 40 is connected to master detector 42, which has the same structure as channel detectors 36 connected to the board under test, converts the signals provided by a given detector back to ECL format and also acts as a buffer. The output of master detector 42 is connected through enable switch 44 (a gate controlled by host computer 30) to the input of edge select circuit 46. The outputs of period generator 16, phase generator 18, and probe generator 48 are similarly connected through enable switches 50, 52, 54, respectively, to the input of edge select circuit 46.

The output of edge select circuit 46 is connected to timer-counter 49, where the frequency of pulses provided by repeated triggering of edge select circuit 46 is compared with the frequency of reference clock 58. The output of edge select circuit 46 is also connected through line 60 and parallel delay line 62, having enabling switches 61, 63, respectively, to or-gate 64, which is in turn connected through switch 65 to provide trigger pulses to the input of period generator 16. Starter circuit 66 is similarly connected to provide an initial trigger pulse to period generator 16.

Figure 2:
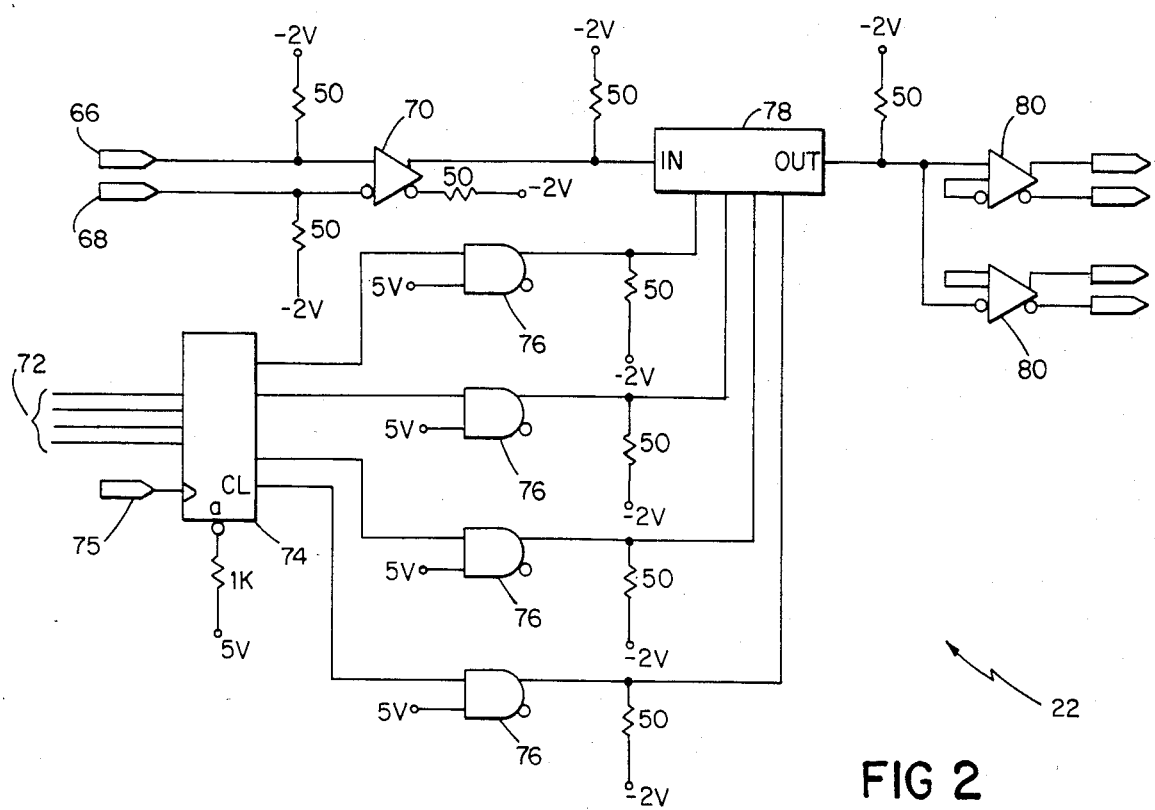
FIG. 2 is a schematic of a deskew circuit of a channel of the FIG. 1 tester.

Referring to FIG. 2, there is shown $T_1$ deskew circuit 22. The other deskew circuits 24, 26 are identical. $T_1$ deskew circuit 22 provides an adjustable delay to the timing pulse passing through it so that the leading edges of the driver output pulses from all channels can be synchronized. $T_2$ deskew circuit 24 similarly provides an adjustable delay so that the trailing edges of driver output pulses can be synchronized, and $T_x$ deskew circuit 26 provides for synchronization of the switching on and off of the drivers. The timing pulse signal for $T_1$ deskew circuit 22 enters at nodes 66, 68 as a differential ECL signal (node 66 carrying the signal, and node 68 carrying its complement) and enters line receiver 70 (10H116). Data lines 72, for receiving information the magnitude of the delay to be added from host computer 30, are connected to quad flip-flop 74 (LS175), which is enabled by a control signal at node 75. The output lines of flip-flop 74 are connected via TTL-to-ECL translators 76 (10124) to programmable delay line 78 (SPECL DL 255, available from Engineering Component Company, San Luis Obispo, Calif.). The output of programmable delay line 78 is sent to a pair of line receivers 80 (10H116) to provide two sets of differential signals, ODDn, ODDn*, EVENn, and EVENn*, which are provided to driver logic 32 (FIG. 1). The range of delay line 78 is 8 ns with a resolution of 500 ps; finer resolutions can be provided by other computer adjusted delay circuits.

Figure 3:
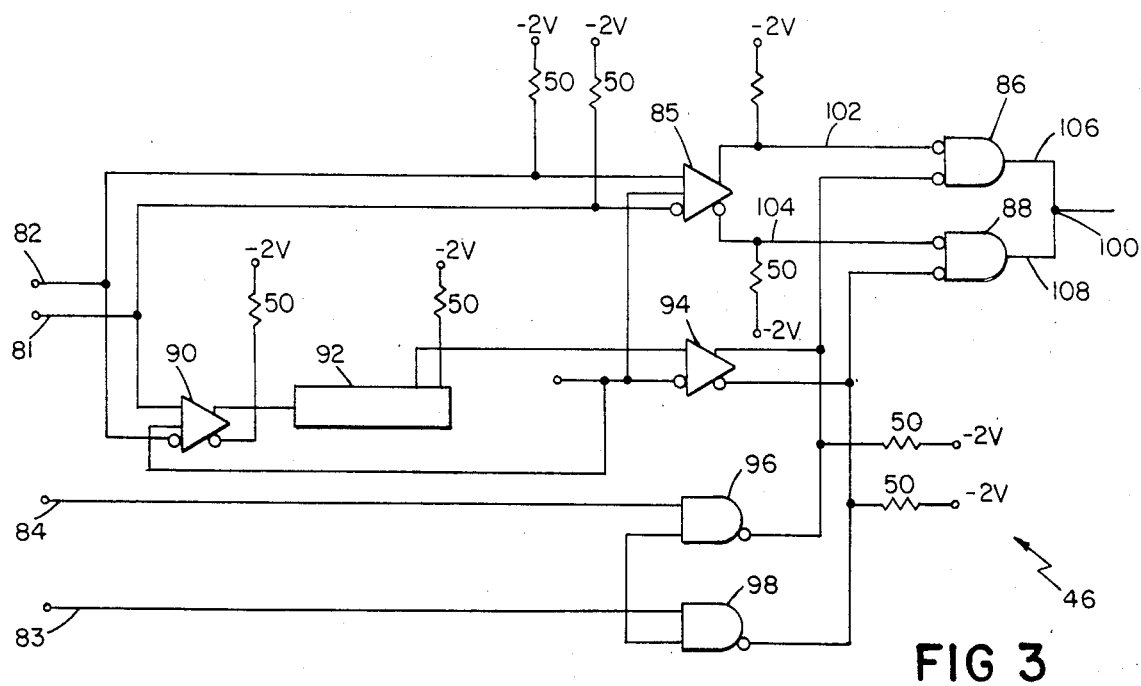
FIG. 3 is a partial schematic of an edge select circuit of the FIG. 1 tester.

Referring to FIG. 3, the components of edge select circuit 46 that permit it to trigger on either the leading or trailing edge are shown. Circuit 46 includes differential ECL signal lines 81, 82 (line 82 carrying the signal, and line 81 carrying its complement), and ENPSLOPE and ENNSLOPE control lines 83, 84 from host computer 30 to enable triggering upon sensing either the positive slope or the negative slope, respectively, of the ECL pulse on lines 81, 82. Differential input lines 81, 82 are directly connected to gates 86, 88 (10102) through line receiver 85 (10216). Lines 82 are also connected through line receiver 90 (10216), delay line 92 (SPECL TCR 527) and line receiver 94 (10216) to gates 86, 88. ENPSLOPE and ENNSLOPE control lines 83, 84 are connected through TTL-to-ECL translators 96, 98 (10124) to gates 86, 88, respectively. The duration of the trigger pulse at node 100, $T_W$, is set by time delay line 92. Lines 102, 104 between line receiver 85 and gates 86, 88, respectively, are structurally identical, as are lines 106, 108 between gates 86, 88 and node 100, for the purpose of providing equal time delays through both paths. Gates 86, 88 are both on the same integrated circuit so as to similarly provide equal time delays.

Figure 4:
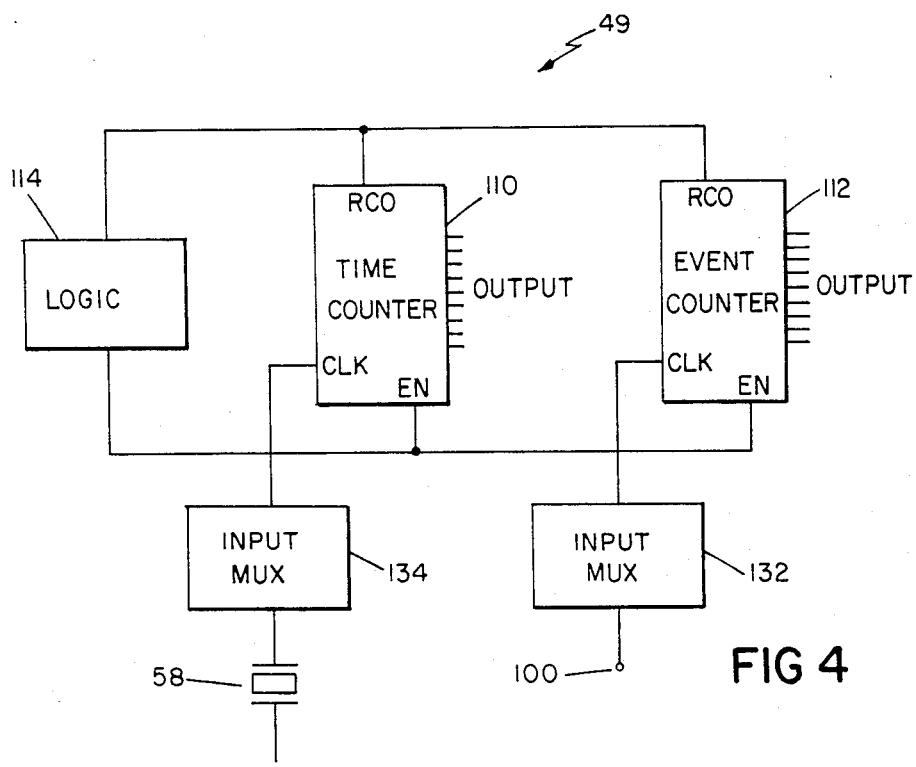
FIG. 4 is a block diagram of a timer-counter circuit of the FIG. 1 tester.

Referring to FIG. 4, there is shown a block diagram of timer-counter 49. Timer-counter 49 includes time counter 110 and event counter 112, both of which are connected to count over a predetermined window established by control logic 114. Clock 58 is connected to time counter 110 through input multiplexer 134, and node 100 (of edge select circuit 46) is connected to event counter 112 through input multiplexer 132. The outputs of time counter 110 and event counter 112 are connected to host computer 30.

Period generator 16, phase generator 18, and probe generator 48 each have deskew circuits that are similar in function to deskew circuits 22-26 and are controlled by host computer 30 for providing adjustable delays to each different path through these circuits.

OPERATION

In operation, the various paths for a timing pulse through circuit tester 10 are sequentially individually connected in a loop through edge select circuit 46 via multiplexers 38, 40, enable switches 44, 50, 52, 54 and other switches in order to set up oscillating timing pulses having associated frequencies that are related to the propagation delay associated with a particular path. After the delay in one path has been adjusted, another path is connected in a loop through edge select circuit 46, and it is adjusted and so on. The adjustment to the delays is referred to herein as deskewing.

When deskewing a channel driver, both the leading and trailing edges of the output pulse provided by driver 34 and the on/off control signals for driver 34 must be separately deskewed. Period generator 16 is connected via switch 65 to be triggered by trigger pulses provided by or-gate 64. A starter pulse is initially provided by starter circuit 66, and period generator 16 and phase generator 18 provide the desired $T_1$, $T_2$, and $T_x$ timing pulses to the particular channel being deskewed. $T_1$ and $T_2$ timing pulses are used by driver logic 32 to provide an output pulse with desired leading and trailing edges at the output of driver 34, and this pulse is then passed through channel multiplexer 38 and slot multiplexer 40 to master detector 42, which converts it back to an ECL differential signal provided through switch 44 to edge select circuit 46.

Figure 6:
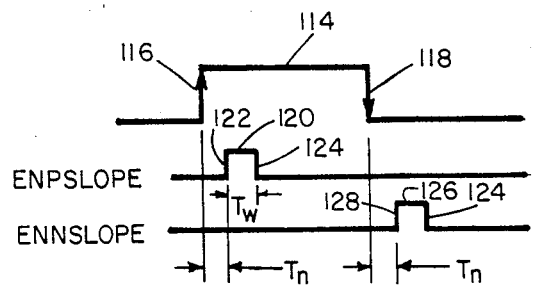
FIG. 6 is a graph showing pulses and trigger pulses of the FIG. 1 tester.

Reffering to FIG. 3, the ECL differential pulse on lines 81, 82 is provided to both line receiver 85 and line receiver 90. The output of line receiver 85 is passed directly to gates 86, 88 for the purpose of initiating the output trigger pulse at node 100. The pulse from line 82 is passed through receiver 90 and delay line 92 and line receiver 94 for the purpose of providing the trailing edge of the output trigger pulse at a time $T_w$ after the leading edge, in order to provide a trigger pulse of known width $T_w$. As is shown in FIG. 6, whether a trigger pulse is generated from the leading edge 116 of timing pulse 114 or from the trailing edge 118 depends upon whether ENPSLOPE line 83 or ENNSLOPE line 84 is enabled. With a pulse having a positive leading edge and a negative trailing edge, as shown in FIG. 6, when ENPSLOPE line 83 is enabled, trigger pulse 120 is provided upon sensing leading edge 116. The leading edge of trigger pulse 120 occurs at a discrete time $T_n$ after the time of the leading edge 116, and this time is associated with the delay through line receiver 85 and the other components upstream of node 100. The trailing edge of trigger pulse 120 occurs at a time $T_w$ later, as is determined by delay line 92. If ENNSLOPE control line 84 is enabled, trigger pulse 126 does not occur until the negative slope of trailing edge 118 is sensed. Again leading edge 128 of trigger pulse 126 occurs at a time $T_n$ after trailing edge 118, and the width of pulse 126 is $T_w$. The reason that delay $T_n$ is the same in both instances is that lines 102, 104, and lines 106, 108 are matched, and gates 86, 88 are in the same package.

Referring again to FIG. 1, the trigger pulse at node 100 is then passed over line 60 to gate 64 and to timer-counter 49. The trigger pulse of gate 64 triggers the next set of timing pulses from period generator 16 and phase generator 18, and another trigger pulse is provided by edge select circuit 46, and so on.

Referring to FIG. 4, the trigger pulses from edge select circuit 46 are also applied through multiplexer 132 to event counter 112. Time counter 110 counts the clock pulses of clock 58, passed through multiplexer 134, while event counter 112 counts the trigger pulses from edge select circuit 46. The counter logic is set up so that time counter 110 and event counter 112 count a predetermined number of events (i.e., trigger pulses), and then the count accumulated in time counter 110 is passed on to host computer 30. This method of measuring time is known as period averaging, and permits one to obtain fine resolution in a small number of counts and thus a small amount of time. Host computer 30 uses the count information to adjust a delay provided to one of the deskew circuits 22, 24, 26. If the leading edge is being sensed by edge select circuit 46, then $T_1$ deskew circuit 22 is adjusted either by increasing or decreasing the delay depending upon whether the number of pulses counted in the time counter is less or more than the counts associated with the desired propagation delay. These adjustments continue until the number of counts counted by time counter 110 is equal to the desired count within the sensitivity provided by adjustable delay line 78. When the edge of the pulse being sensed by edge select circuit 46 is the trailing edge, then the adjustments are made by using $T_2$ deskew circuit 24 in a similar manner. When the Tx on/off path is being deskewed, switch 136 connects termination resistor 138, to create a trailing edge dependent upon the occurrence of $T_x$; $T_1$ is used to provide the leading edge of the timing pulse, and the trailing edge is sensed by edge select circuit 46.

The different paths of phase generator 18 are similarly deskewed by closing switch 52 and disconnecting switches 44, 50, 54 so that the loop passes through 16-phase phase generator 18. One path is connected in the loop at one time, and once again a timing pulse is set up in an oscillating mode, and the frequency is measured and adjusted by the use of adjustable delays. Period generator 16 and probe generator 18 are similarly deskewed.

Delay line 62 provides a means of inserting a known delay into any loop so that a trigger pulse is not provided before the minimum retrigger time of period generator 16.

An advantage of this system is that jitter at the driver output due to noise and degraded edge speed is automatically dealt with by the period-averaging method.

Other Embodiments

Other embodiments of the invention are within the scope of the following claims.

E.g., in a multiple channel tester where each channel has its own timing generator, the adjustable delay could be provided by the timing generator. Also, other means for providing an adjustable delay could be used; e.g., a differential delay line could be used. Instead have having multiplexers 38, 40 with equal propagation delay for all paths, multiplexers having well known propagation delays for the paths can be used, and the differences will be taken into account in providing the adjustable delays.

What is claimed is:

1. Circuitry for synchronizing a multiple channel circuit tester comprising
   a clock,
   a plurality of drivers for providing output pulses to a device under test,
   timing pulse circuitry having a plurality of different paths for transmitting said timing pulses to said drivers, said timing pulse circuitry comprising timing pulse means for generating timing pulses based upon a clock pulse from said clock or a trigger pulse and for providing an adjustable delay, trigger means for providing a trigger pulse to said timing pulse means based upon a timing pulse that has reached the end of a given path in said timing pulse circuitry to trigger the following timing pulse, thereby providing oscillating timing pulses having an associated frequency related to the propagation delay of a single timing pulse through said given path, and comparison means for comparing said associated frequency with a reference frequency of known magnitude and for providing adjustment signals to said timing pulse means for providing a delay to timing pulses passing through said given path, said adjustment signals causing said associated frequency to match a desired frequency.

2. The circuitry of claim 1 wherein said timing pulse means comprises a timing pulse generator and a plurality of adjustable delay means in said different paths for receiving said adjustment signals and providing said delay.

3. The circuitry of claim 2 wherein said trigger means comprises edge select means for sensing either the leading or the trailing edge of a timing pulse provided to it and for providing a trigger pulse at either the leading or trailing edge.

4. The circuitry of claim 3 wherein said edge select means comprises means for providing a trigger pulse of a predetermined period.

5. The circuitry of claim 3 wherein said edge select means comprises means for sensing either a positive or a negative slope of a pulse provided to it.

6. The apparatus of claim 1 wherein said comparison means comprises a time counter and an event counter, said time counter counting clock pulses from a fixed period clock, said event counter counting trigger pulses provided by said trigger means, both said counters being connected to be enabled and disabled simultaneously.

7. The circuitry of claim 2 wherein said timing pulse generator is connected to provide timing pulses to said drivers, and said drivers connected to provide driver output pulses to said trigger means.

8. The circuitry of claim 7 wherein said trigger means comprises edge select means for sensing either the leading or the trailing edge of a timing pulse provided to it and for providing a trigger pulse at either the leading or trailing edge.

9. The circuitry of claim 8 wherein said timing pulse circuitry includes driver logic providing an output timing pulse initiated by an assert timing pulse and ended by a return timing pulse, and a first path for an assert timing pulse and a second path for a return timing pulse from said timing pulse generator to said driver logic, and wherein there are separate adjustable delay means in said first and second paths.

10. The circuitry of claim 9 wherein said driver logic includes means for turning a said driver on or off upon receiving an on/off timing pulse, and said timing pulse circuitry includes a third path for said on/off timing pulse and an adjustable delay means in said third path.

11. The circuitry of claim 7 further comprising a multiplexer connected to the outputs of a plurality of said drivers for selectively connecting the outputs of said drivers to said device under test or to said trigger means.

12. The circuitry of claim 7 further comprising a multiplexer connected to the outputs of a plurality of said drivers for selectively connecting an output of said driver to said trigger means, said multiplexer having known propagation delays associated with the paths through it from said driver outputs to said trigger means.

13. The circuitry of claim 7 further comprising a multiplexer connected to the outputs of a plurality of said drivers for selectively connecting an output of a said driver to said trigger means, said multiplexer having equal propagation delays associated with the paths through it from said driver outputs to said trigger means.

14. The circuitry of claim 2 further comprising a delay line connected between said trigger means and said timing pulse generator so that a said trigger pulse is provided after the minimum retrigger time of said timing pulse generator.

15. The circuitry of claim 2 further comprising a starter circuit to provide an initial trigger pulse to said timing pulse generator.

16. The circuitry of claim 7 further comprising a multiplexer connected to the outputs of a plurality of said drivers for selectively connecting an output of said driver to said trigger means, connections from a path in said timing pulse generator to said trigger means, and selection means for selectively connecting either the output of said multiplexer or said path in said timing pulse generator to said trigger means.

17. The circuitry of claim 16 wherein said timing pulse generator includes a period generator and a phase generator, and there are a plurality of connections between plural paths in said period and phase generators and said trigger means, and said selection means includes means to selectively connect a said plural path or said output of said multiplexer.

18. The circuitry of claim 7 wherein said adjustable delay means is a digitally controlled delay line, wherein said timing pulse circuitry includes a pair of differential signal lines for providing said pulses to said drivers and a first line receiver connected to said pair and to the input to said digitally controlled delay line, and wherein the output of said delay line is connected to a second line receiver to provide a differential output signal.

* * * * *